(12) United States Patent
Watanabe et al.

(10) Patent No.: US 12,154,610 B2
(45) Date of Patent: Nov. 26, 2024

(54) SEMICONDUCTOR DEVICE AND SEMICONDUCTOR SYSTEM

(71) Applicant: RENESAS ELECTRONICS CORPORATION, Tokyo (JP)

(72) Inventors: Genta Watanabe, Tokyo (JP); Ken Matsubara, Tokyo (JP); Tomoya Saito, Tokyo (JP); Akihiko Kanda, Tokyo (JP); Koichi Takeda, Tokyo (JP); Takahiro Shimoi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 143 days.

(21) Appl. No.: 17/847,967

(22) Filed: Jun. 23, 2022

(65) Prior Publication Data

US 2023/0025357 A1 Jan. 26, 2023

(30) Foreign Application Priority Data

Jul. 21, 2021 (JP) .................. 2021-120948

(51) Int. Cl.
*G11C 11/08* (2006.01)
*G11C 11/16* (2006.01)

(52) U.S. Cl.
CPC ...... *G11C 11/1675* (2013.01); *G11C 11/1677* (2013.01); *G11C 11/1697* (2013.01)

(58) Field of Classification Search
CPC ............ G11C 11/1675; G11C 11/1677; G11C 11/1697; G11C 5/145; G11C 13/0038; G11C 13/0064; G11C 13/0069

(Continued)

(56) References Cited

U.S. PATENT DOCUMENTS 5,444,664 A 8/1995 Kuroda et al.
6,091,640 A 7/2000 Kawahara et al.
(Continued)

FOREIGN PATENT DOCUMENTS

JP H07-29386 A 1/1995
JP 2007-164880 A 6/2007
(Continued)

OTHER PUBLICATIONS

Extended European Search Report issued in corresponding European Patent Application No. 22184312.1, dated May 17, 2023.

(Continued)

*Primary Examiner* — Tha-O H Bui
(74) *Attorney, Agent, or Firm* — Rimon P.C.

(57) ABSTRACT

A semiconductor device capable of changing a data programming process in a simple manner according to a situation is provided. The semiconductor device includes a plurality of memory cells, a programming circuit for supplying a programming current to the memory cell, and a power supply circuit for supplying power to the programming circuit. The power supply circuit includes a charge pump circuit for boosting the external power supply, a voltage of the external power supply according to the selection indication, and a selectable circuit capable of switching the boosted voltage boosted by the charge pump circuit. The control circuit further includes a control circuit for executing data programming processing by the programming circuit by switching the selection indication.

6 Claims, 9 Drawing Sheets

(58) Field of Classification Search
USPC .......................................................... 365/143
See application file for complete search history.

(56) References Cited

U.S. PATENT DOCUMENTS

| | | |
|---|---|---|
| 8,693,238 B2 | 4/2014 | Sakimura et al. |
| 2004/0027907 A1* | 2/2004 | Ooishi .................... G11C 11/15 |
| | | 365/226 |
| 2005/0232013 A1 | 10/2005 | Kawai et al. |
| 2006/0056229 A1 | 3/2006 | Maeda et al. |
| 2016/0180908 A1 | 6/2016 | Zhou et al. |
| 2017/0154655 A1 | 6/2017 | Seo |
| 2020/0161320 A1* | 5/2020 | Yamaguchi ............ H10B 41/41 |

FOREIGN PATENT DOCUMENTS

| | | |
|---|---|---|
| JP | 2010-055748 A | 3/2010 |
| WO | 2008/018266 A1 | 2/2008 |

OTHER PUBLICATIONS

Office Action dated Jul. 9, 2024, from corresponding JP Application No. 2021-120948, 15 pages.

* cited by examiner

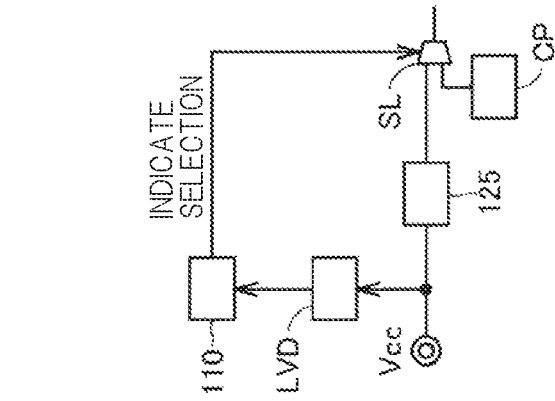
FIG. 11A  FIG. 11B
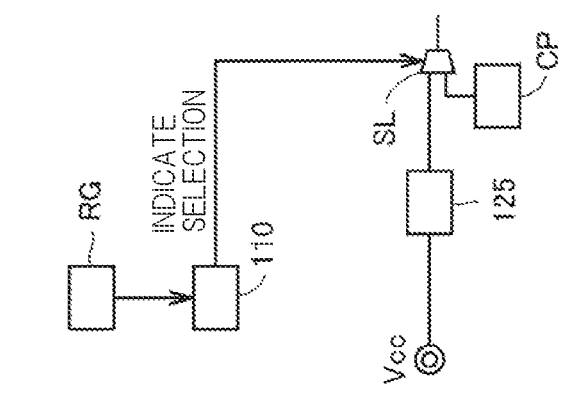
FIG. 11C  FIG. 11D
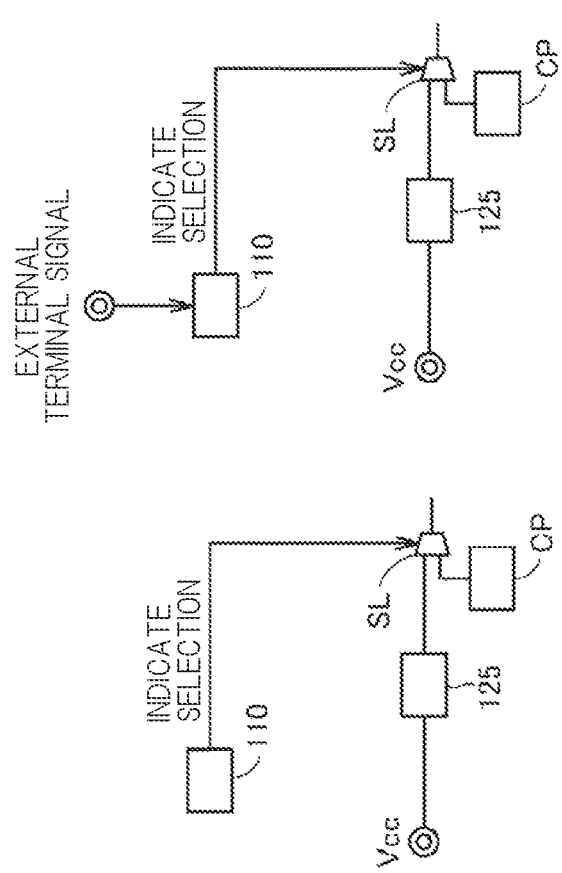

SEMICONDUCTOR DEVICE AND SEMICONDUCTOR SYSTEM

CROSS-REFERENCE TO RELATED APPLICATION

This disclosure of Japanese Patent Application No. 2021-120948 filed on Jul. 21, 2021 including the specification, drawings and abstract is incorporated herein by reference in its entirety.

BACKGROUND

On the other hand, a charge pump circuit may not necessarily be required in some situations.

The present disclosure provides a semiconductor device and a semiconductor system for solving the above problems and capable of changing the data programming process in a simple manner according to the situation.

Other problems and novel features will become apparent from the description herein and from the accompanying drawings.

According to an embodiment, a semiconductor device includes a plurality of memory cells, a programming circuit for supplying a programming current to the memory cell, and a power supply circuit for supplying power to the programming circuit. Power supply circuit includes a charge pump circuit for boosting the external power supply, a voltage of the external power supply according to the selection indication, and a selectable circuit capable of switching the boosted voltage boosted by the charge pump circuit. The control circuit further includes a control circuit for executing data write processing by the programming circuit by switching the selection indication.

According to yet another embodiment, a semiconductor system includes a storage unit and a CPU for controlling the storage unit. The storage unit includes a plurality of memory cells, a programming circuit for supplying a programming current to the memory cell, and a power supply circuit for supplying power to the programming circuit. Power supply circuit includes a charge pump circuit for boosting the external power supply, a voltage of the external power supply according to the selection indication, and a selectable circuit capable of switching the boosted voltage boosted by the charge pump circuit. The control circuit further includes a control circuit for switching the selection indication and executing a data write process by the programming circuit.

According to one embodiment, by switching the selection indication and executing the data write processing by the programming circuit, for example, when the external power supply is high, the data write processing in which the external power supply is directly used by the selection indication is executed. For example, when the external power supply is low, it is possible to execute the data programming process using the charge pump circuit according to the selection indication, it is possible to realize a semiconductor device and a semiconductor system in which the data programming process can be changed in a simple manner according to the situation.

BRIEF DESCRIPTIONS OF THE DRAWINGS

FIGS. 11A to 11D are diagrams for explaining the generation of a selection indication of the sequencer 110 based on a second modification example of the embodiment.

DETAILED DESCRIPTION

Figure 1:
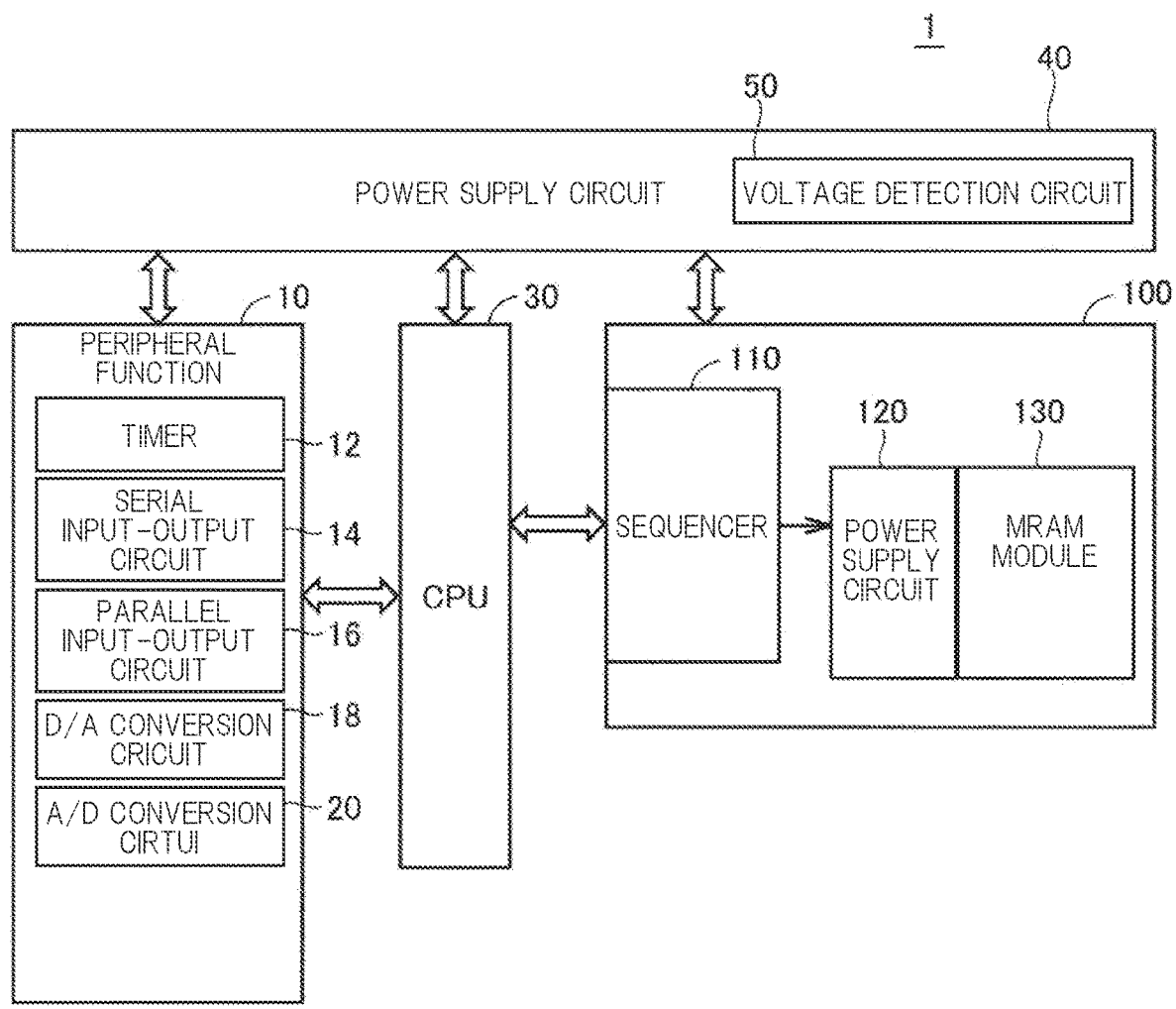
FIG. 1 is a schematic block diagram showing the overall configuration of a semiconductor system 1 according to an embodiment of the present disclosure.

Embodiments of the present disclosure will be described in detail with reference to the accompanying drawings. Incidentally, the same or equivalent parts in the figure are denoted by the same reference numerals, the description thereof will not be repeated.

FIG. 1 is a schematic block diagram showing the overall configuration of a semiconductor system 1 according to an embodiment of the present disclosure.

Referring to FIG. 1, the semiconductor system 1 includes a CPU (Central Processing Unit) 30, A power supply circuit 40 includes a peripheral function 10 and a storage unit (storaging circuitry) 100.

Power supply circuit 40 supplies power to each unit. Power supply circuit 40 includes a voltage detection circuit 50 detects the voltage level of the power supplied to the semiconductor system 1.

Peripheral function 10 includes a timer 12 for counting the time, a serial input-output circuit 14, parallel input-output circuit 16, a D/A conversion circuit 18, and an A/D conversion circuit 20. Note that the peripheral function 10 is not limited thereto, and may have a configuration including other functions.

The storage unit 100 includes a sequencer 110, which is a control circuit for controlling the entire storage unit, a power supply circuit 120, and a MRAM module 130.

The sequencer 110 controls a data write process, a data read process, and the like for MRAM module 130.

The power supply circuit 120 receives a voltage from the power supply circuit 40 and supplies the voltage as an inner voltage to MRAM modules 130.

MRAM module 130 has a memory cell that is a plurality of storage elements.

Figure 2:
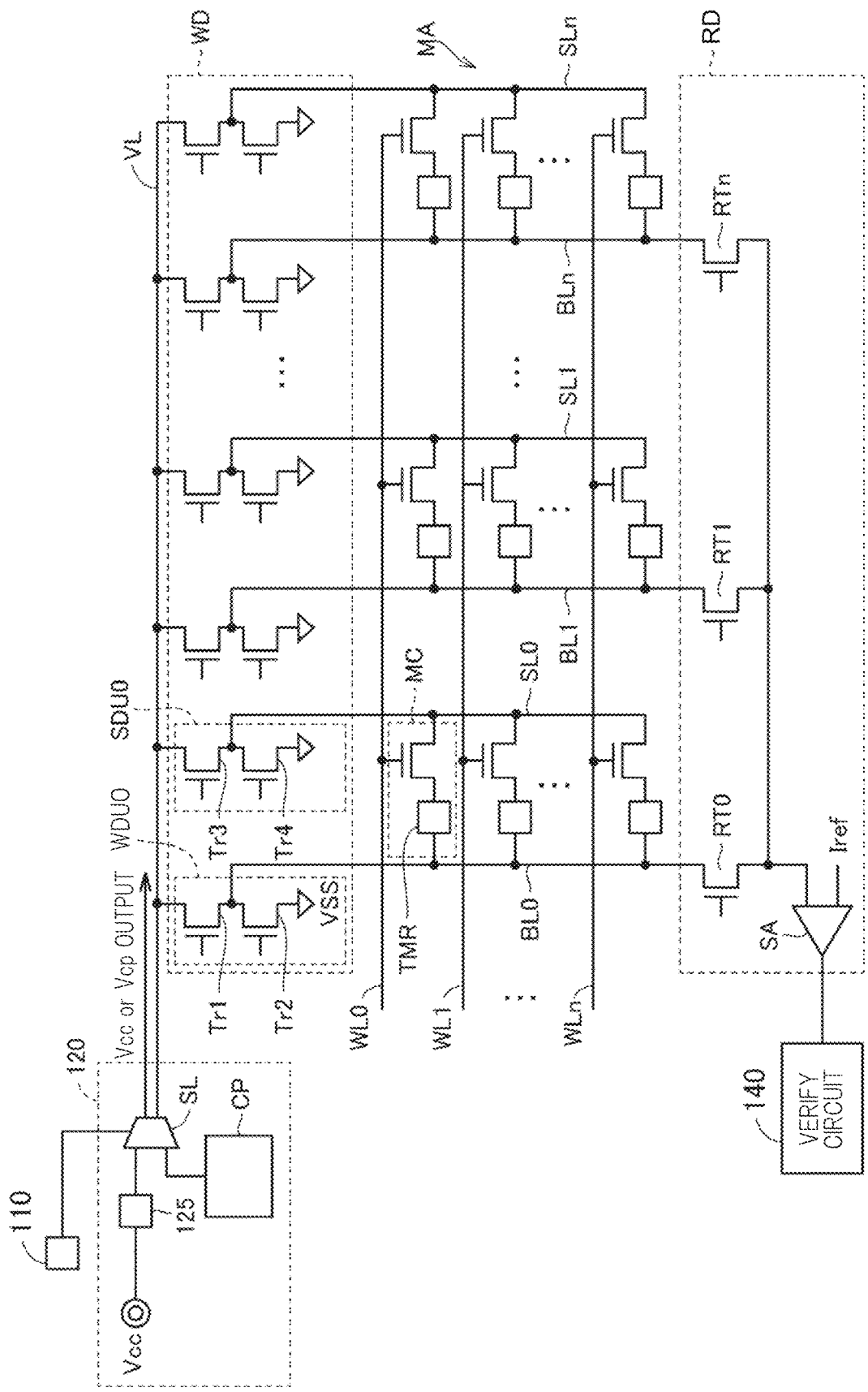
FIG. 2 is a diagram illustrating a configuration of a storage unit 100 according to the embodiment.

FIG. 2 is a diagram illustrating a configuration of a storage unit 100 according to the embodiment.

Referring to FIG. 2, the storage unit 100 includes a sequencer 110, a memory array MA including a memory cell MC, each of which is arranged in a matrix, a programming circuit WD, a read circuit RD, a power supply circuit 120, and a verify circuit 140. Here, rows and columns of a plurality of memory cells MC arranged in a matrix of each of the memory arrays MA are also referred to as memory cell rows and memory cell columns, respectively. Incidentally, a row decoder (not shown), also includes a column decoder or the like.

The row decoder performs row selection in the memory array MA to be selectively accessed based on the row addresses contained in the address signals. The column decoder also executes column selection of the memory array MA to be selectively accessed based on the column addresses included in the address signal.

In the following, binary high voltage state and low voltage state, such as signals, signal lines and data, also referred to as "H" level and "L" level, respectively.

In the present exemplary embodiment, a single memory cell MC is typically shown in the memory array MA, and a word line WL provided corresponding to the memory cell row and a bit line BL and a source line SL provided corresponding to the memory cell row are typically shown one by one.

The memory cell MC is configured to be connected between the bit line BL and the source line SL. The memory array MA includes a memory cell MC integrated in a matrix. (n+1) A row and (n+1) column memory cell MC is located. A plurality of bit lines BL and a source line SL respectively provided corresponding to the memory cell rows are included. As an example, bit lines BL0 to BLn and source lines SL0 to SLn are provided. Further, it includes a plurality of word lines WL provided corresponding to each memory cell row. An exemplary word-line WL0-WLn is provided. Further, the source line SL and the bit line BL are provided along the column direction in the same direction, respectively. Furthermore, provided corresponding to each of the plurality of source lines SL, a plurality of gate transistors RT for electrically coupling a data line for reading and one of the plurality of bit lines BL is provided. By way of example, gate transistors RT0 to RTn are provided. Note that the gate of the gate transistor RT, it is assumed that the column selection signal is input from the column decoder.

Power supply circuit 120 includes a terminal for receiving the supply of the voltage Vcc of the external power supply, a regulator 125, a charge pump circuit CP, and a selector SL.

The regulator 125 stabilizes the supply of a voltage of voltage Vcc. Selector SL switches the voltage supplied to the power line VL according to the selection indication from the programmable controller 110. Specifically, the selector SL switches the voltage Vcc output from the regulator 125 according to a selection indication from the sequencer 110, and the output of the boosted voltage Vcp output from the charge pump circuit CP. It is also possible to configure without providing the regulator 125.

For example, the power supply line VL according to the selection indication from the sequencer 110 ("L" level), the voltage Vcc is supplied by the switching of the selector SL. Further, the power supply line VL according to the selection indication from the sequencer 110 ("H" level), the voltage Vcp is supplied by the switching of the selector SL.

The programming circuit WD includes a write unit (writing circuitry) WDU provided corresponding to the bit line BL and a write unit SDU provided corresponding to the source line SL.

As an example, a writing unit WDU0 corresponding to the bit line BL0 and a writing unit SDU0 corresponding to the source line SL0 are shown. The same applies to other bit lines BL and source lines SL.

Data writing is performed on the selected memory cell MC using the write unit WDU and SDU.

The write unit WDU includes a transistor Tr1, Tr2. The transistor Tr1 is connected between the power supply line VL and the inner node connected to the bit line BL, the gate receives the input of the first write select signal based on the write data. The transistor Tr2 is connected between an inner node connected to the bit line BL and a fixed voltage VSS, the gate receiving an input of a second write select signal based on the write data.

The write unit SDU includes a transistor Tr3,Tr4. The transistor Tr3 is connected between a power supply line VI and an inner node connected to the source line SL, the gate receiving an input of a second write select signal based on the write data. The transistor Tr4 is connected between an inner node connected to the source line SL and a fixed voltage VSS, the gate receiving an input of a first write select signal based on the write data.

When the data write process is executed, either one of the first and second write select signals is set to the "H" level. When the data write process is not executed, the first and second write select signals are set to the "L" level.

The write units WDU and SDU corresponding to the selected column are driven and the word line WL of the selected row is activated to allow data write processing to be performed on the selected memory cell MC. Incidentally, by activating the word line WL of the selected row and driving the write units WDU and SDU for a plurality of selected columns, parallel data programming processing for a plurality of selected memory cells MC is possible. Specifically, it is possible to write data to the memory cell MC of (n+1) bits.

Readout circuit RD includes a sense amplifier SA, and a plurality of gate transistors GT provided corresponding to the bit line BL, respectively. The gate transistor GT is turned on according to the column select signal, and the selected bit line BL and the sense amplifier SA are electrically connected.

The sense amplifier SA compares the data read current Iread flowing through the bit line BL and the reference current Iref, and outputs the read data RDT based on the comparison result.

The verification circuit 140 determines whether or not the read data RDT and the data written in the selected memory cell that has instructed the data write process are the same.

The verify circuit 140 outputs a determination result to the sequencer 110.

The programmable controller 110 can identify the portion in question when a data write error has occurred based on a determination result from the verification circuit 140. Then, the data programming process is instructed again to the bit in which the data programming error has occurred.

The programmable controller 110 instructs execution of a plurality of bits of parallel data write processing and executes verification processing using the verification circuit 140 to determine whether or not a data write error has occurred. When the sequencer 110 determines that a data write error has occurred by the validation process, it identifies the memory cell in which the data write error has occurred and re-executes the data write process for the memory cell.

Figure 3A:
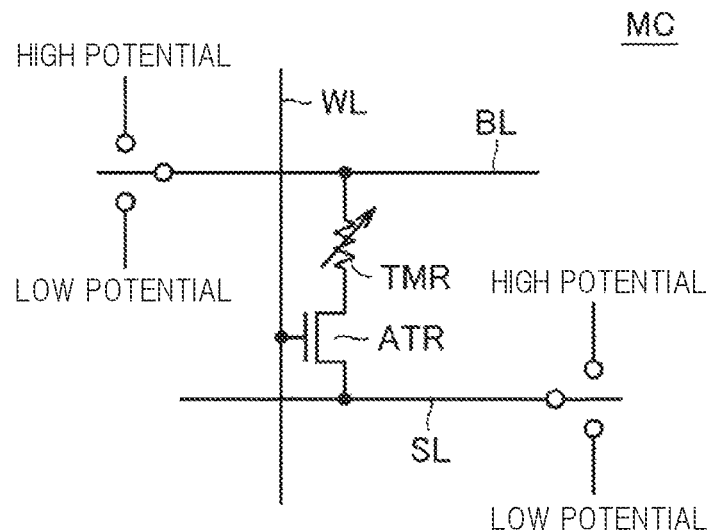
FIGS. 3A and 3B are conceptual diagrams illustrating a memory cell MC according to a first embodiment of the present disclosure.
Figure 3B:
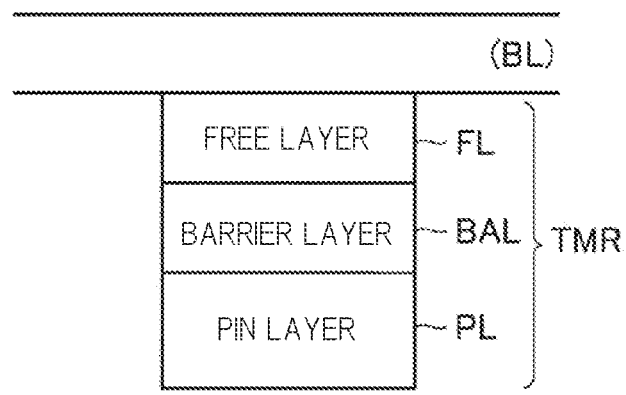

FIGS. 3A and 3B are conceptual diagrams illustrating a memory cell MC according to a first embodiment of the present disclosure. Referring to FIG. 3A, a memory cell MC according to an embodiment 1 of the present disclosure includes a tunnel magnetoresistive element TMR and an access transistor ATR. The tunnel magnetoresistive element TMR and the access transistor ATR is connected in series between the bit line BL and the source line SL. Specifically, the access transistor ATR is provided between the source line SL and the tunnel magnetoresistive element TMR, the gate is electrically coupled to the word line WL. Also, the tunnel magnetoresistive element TMR is electrically coupled between the access transistor ATR and the bit line BL.

As described later, as a configuration for performing data programming to the memory cell MC, at least one side of the bit line BL and the source line SL is set to a high potential or a low potential. That is, in data programming, data programming is performed by forming a current path from the bit line BL side to the source line SL side or from the source line SL side to the bit line BL side via the memory cell MC.

FIG. 3B is a diagram for explaining a cross-sectional view of a tunnel magnetoresistive element TMR.

Referring to FIG. 3B, the tunnel magnetoresistive element TMR, a ferromagnetic layer having a fixed constant magnetization direction (fixed layer) (hereinafter, also referred to as a pin layer) PL, a ferromagnetic layer magnetization direction is reversed by the current flowing into the element (free layer) (hereinafter, simply referred to as a free layer) FL, and a tunnel barrier (tunnel film) BAL formed of an insulator film between the pin layer PL and the free layer FL.

The free layer FL is magnetized in the same direction as the pin layer PL or in the direction opposite to the pin layer PL according to the direction in which the data programming current flowing in accordance with the level of the stored data to be written. Magnetic tunnel junctions are formed by these pin layer PL, barrier layer BL and free layer FL.

Electrical resistance of the tunnel magnetoresistive element TMR varies according to the relative relationship between the respective magnetization directions of the pin layer PL and the free layer FL. Specifically, the electric resistance of the tunneling magnetoresistive element TMR, when the magnetization direction of the magnetization direction and the pin-layer PL of the free layer FL is the same (parallel) becomes a low-resistance state (minimum value) Rmin, the magnetization direction of both are different (antiparallel) direction when it is a high-resistance state (maximum value) Rmax.

During data programming, the word line WL is activated and the access transistor ATR is turned on. In this state, the magnetization direction of the free layer FL changes depending on whether the data programming current is supplied from the free layer FL to the pin layer PL or the data programming current is supplied from the pin layer PL to the free layer FL.

Figure 4A:
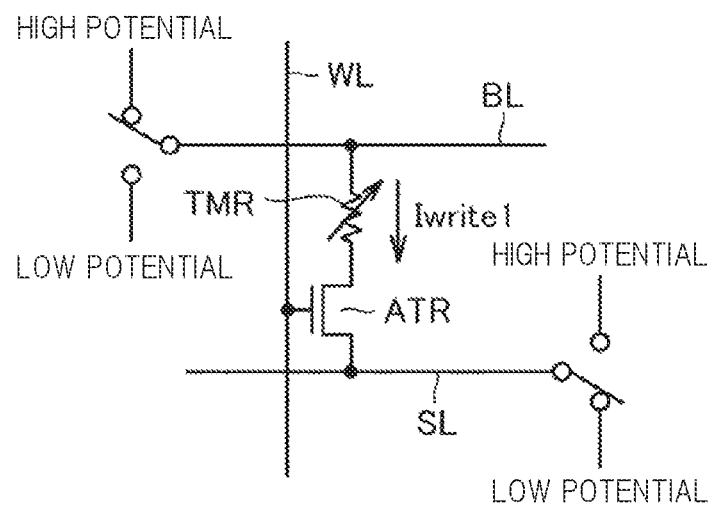
FIGS. 4A and 4B are diagrams illustrating data programming of a memory cell MC according to a first embodiment of the present disclosure.
Figure 4B:
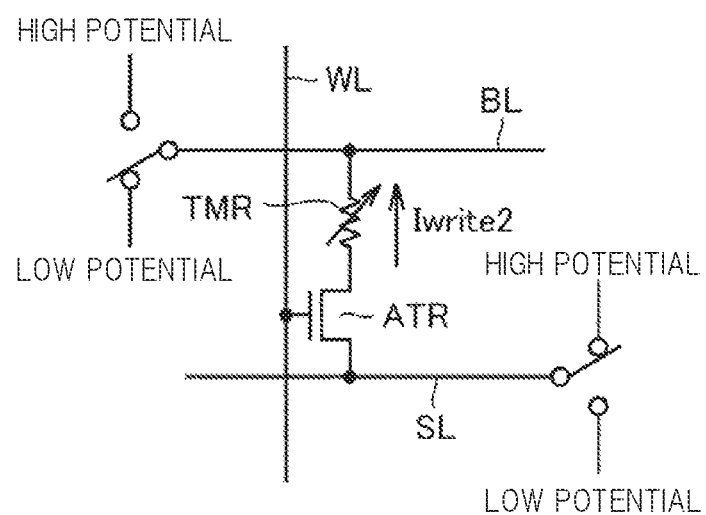

FIGS. 4A and 4B are diagrams illustrating data programming of a memory cell MC according to a first embodiment of the present disclosure.

Referring to FIG. 4A, here, for example, the transistor Tr1 of the write unit WDU is turned on according to the input of the first write selection signal ("H" level) according to the write data ("0") and the transistor Tr4 of the write unit SDU is turned on.

Along with this, the bit line BL is electrically connected to the high potential, the source line SL is a state of being electrically connected to the low potential. In this case, the data programming current Iwrite1 from the bit line BL side to the source line SL side flows to the tunnel magnetoresistive element TMR. That is, current flows from the free layer to the pin layer PL.

Referring to FIG. 4B, here, for example, the transistor Tr2 of the write unit WDU is turned on according to the input of the second write selection signal ("H" level) according to the write data ("1") and the transistor Tr3 of the write unit SDU is turned on.

Along with this, the bit line EL is electrically connected to the low potential, the source line SL is a state of being electrically connected to the high potential. In this case the data programming current Iwrite1 from the source line SL side to the bit line BL side flows to the tunneling magnetoresistive device TMR. That is, the current flows from the pin layer PL to the free layer FL.

FIG. 5 is a diagram illustrating the inversion of the magnetization direction of the memory cell MC according to the first embodiment of the present disclosure.

Figure 5A:
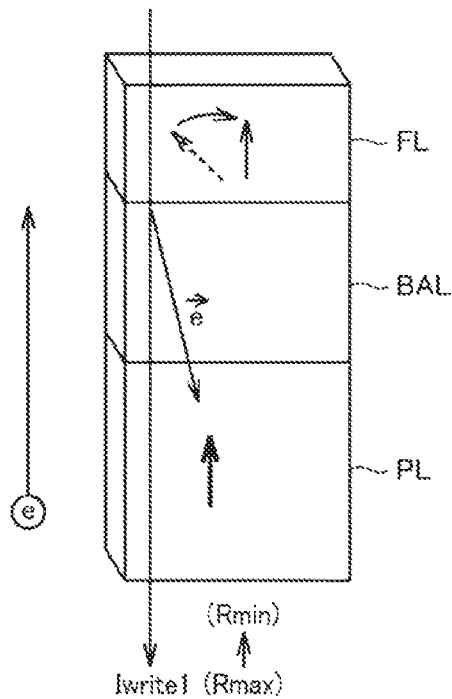
FIGS. 5A and 5B are diagrams illustrating the inversion of the magnetization direction of the memory cell MC according to the first embodiment of the present disclosure.

Referring to FIG. 5A, it is a diagram illustrating a case where the data programming current Iwrite1 flows from the bit line EL side to the source line SL side.

Here, the case where the pin layer PL is magnetized in the direction from the bottom to the top is shown. Then, the injected spin-polarized electrons flow from the direction opposite to the direction of the data-writing current Iwrite1, so that the spin electrons in the same direction as the magnetization direction of the pin-layer PL flow into the free layer FL. Therefore, the magnetization direction of the free layer FL becomes the same direction or parallel to the pin layer PL.

Figure 5B:
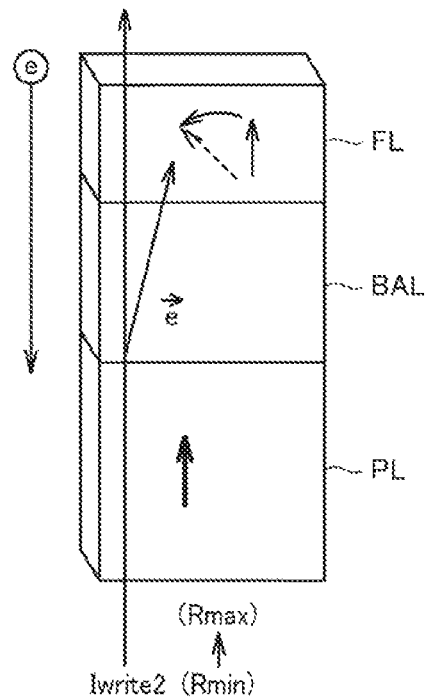

Referring to FIG. 5B, it is a diagram illustrating a case where the data programming current Iwrite2 flows from the source line SL side to the bit line BL side.

Here, the case where the pin layer PL is magnetized in the direction from the bottom to the top is shown. Then, the injected spin-polarized electrons will flow from the direction opposite to the direction of the data-writing current Iwrite2, that is, spin-polarized electrons will flow from the free-layer FL into the pin-layer PL. Then, the spin polarized electrons flowing in from the free layer FL pass through the spin polarized electrons in the same direction as the pin layer PL, and the spin polarized electrons in the opposite direction reflect and act on the free layer FL, and change in the different direction from the pin layer PL. Thus, the magnetization direction of the free layer FL and the pin layer PL is different (antiparallel) state.

As for the magnitude of the current between the data programming current Iwrite1 and Iwrite2, the spin electrons in the same direction as passing through the pin layer PL act on the free layer FL to determine the magnetization direction, whereas the data programming current Iwrite2 requires a larger current to determine the magnetization direction by the reflected spin electrons acting on the free layer FL. That is, the data-writing current Iwrite2 is set to a value larger than Iwrite1.

Next, the data reading will be described.

In the embodiments of the present disclosure, a case will be described in which the direction in which the data read current flows from the pin layer to the free layer.

As described above, the data programming current Iwrite2 from the pin layer PL side to the free layer FL side described in FIGS. 5A and 5B is larger than the data programming current Iwrite1 from the free layer FL side to the pin layer PL side. It is considered that the data read current is a value smaller than the data programming current, and that the direction of the data read current is less affected by the read disc turb in which the data is reversed when the data is flowed from the pin layer PL side, which is the same direction as the data programming current Iwrite2, which is a value having a larger current amount than the data programming current Iwrite1, to the free layer FL side.

Therefore, in the embodiment of the present disclosure sense amplifier SA included in the read circuit RD so that the data read current flows from the pin layer PL side to the free layer FL side, i.e. from the source line SL side to the bit line BL side is connected.

Specifically, one end of the sense amplifier SA is electrically coupled to the bit line BL via the gate transistor RT. Then, the other end of the sense amplifier SA, the reference current Iref is supplied at the time of data reading.

Assuming that the sense amplifier SA detects a current flowing into the sense amplifier SA as an example, depending on the configuration of the sense amplifier, the source line SL side is electrically coupled to the high potential side, and the sense amplifier SA side is electrically coupled to the low potential side (for example, a fixed voltage VSS). Accordingly, at the time of data reading, the data read current Iread corresponding to the resistance value of the memory cell MC is supplied to the sense amplifier SA through the memory cell MC and the bit line BL from the source line SL side.

Then, the sense amplifier SA compares the data read current Iread and the reference current Iref, and outputs the read data RDT based on the comparison result.

In this example, the sense amplifier SA may be configured to execute a plurality of bits of data read by providing a plurality of configurations for executing one-bit data read because it is a configuration provided.

Figure 6:
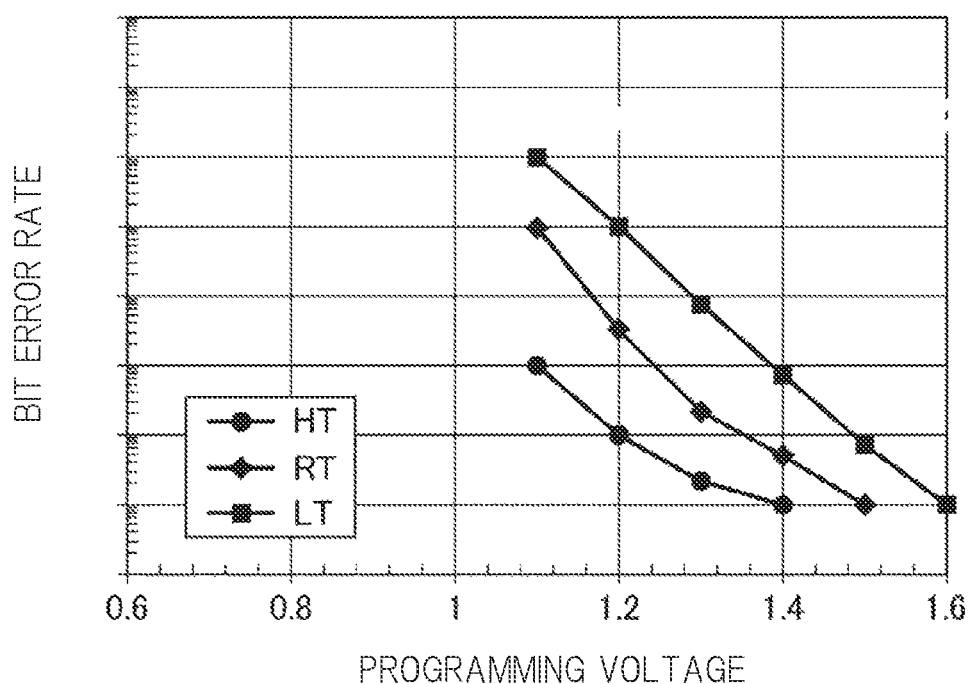
FIG. 6 is a diagram for explaining the relationship between the write voltage and the bit error rate.

FIG. 6 is a diagram for explaining the relationship between the write voltage and the bit error rate.

Referring to FIG. 6, in this example, assume a case where 1.2V is supplied as a write voltage as an example. The types of memory cell MC are shown as bit error rates in high temperature state (HT), normal state (RT), and low temperature state (LT).

It has been shown that the higher the write voltage, the lower the bit error rate. That is, even in the case of a high temperature state (HT), it can be seen that a very low bit error rate when supplying a write voltage 1.6V.

In the embodiment, a case in which a plurality of data programming methods can be selected will be described.

Specifically, a case in which the data programming method of the first to third modes can be selected will be described.

As an example, the data write method is changed according to the voltage level of the supplied write voltage.

At this point, the data write method is changed according to the voltage range of the voltage of the supplied external power supply.

The data write method of the first mode executes the data write processing using the voltage Vcc of the external power supply to be supplied. Identifies the memory cell in which the validation process caused a data write error.

The data write process is executed using the boost voltage Vcp by the charge pump circuit CP for the memory cell in which the data write error occurs.

The data write method of the second mode executes the data write processing using the voltage Vcc of the external power supply to be supplied. Identifies the memory cell in which the validation process caused a data write error.

The data write process is executed using the voltage Vcc of the external power supply supplied to the memory cell in which the data write error occurs.

The data write method of the third mode executes the data write processing using the voltage Vcc of the external power supply to be supplied. In this case, the verification process is not executed. As an example, it is determined whether or not the first voltage (1.2V) or less as the voltage range of the external power supply supplied.

When the voltage of the external power supply to be supplied is equal to or lower than the first voltage (1.2V), the data write method of the first mode is executed.

When the voltage of the external power supply to be supplied is greater than the first voltage (1.2V) and is equal to or less than the second voltage (1.6V), the data write method of the second mode is executed.

When the voltage of the external power supply to be supplied is larger than the second voltage (1.6V), the data write method of the third mode is executed. The value of the voltage can be set to an arbitrary value.

Figure 7:
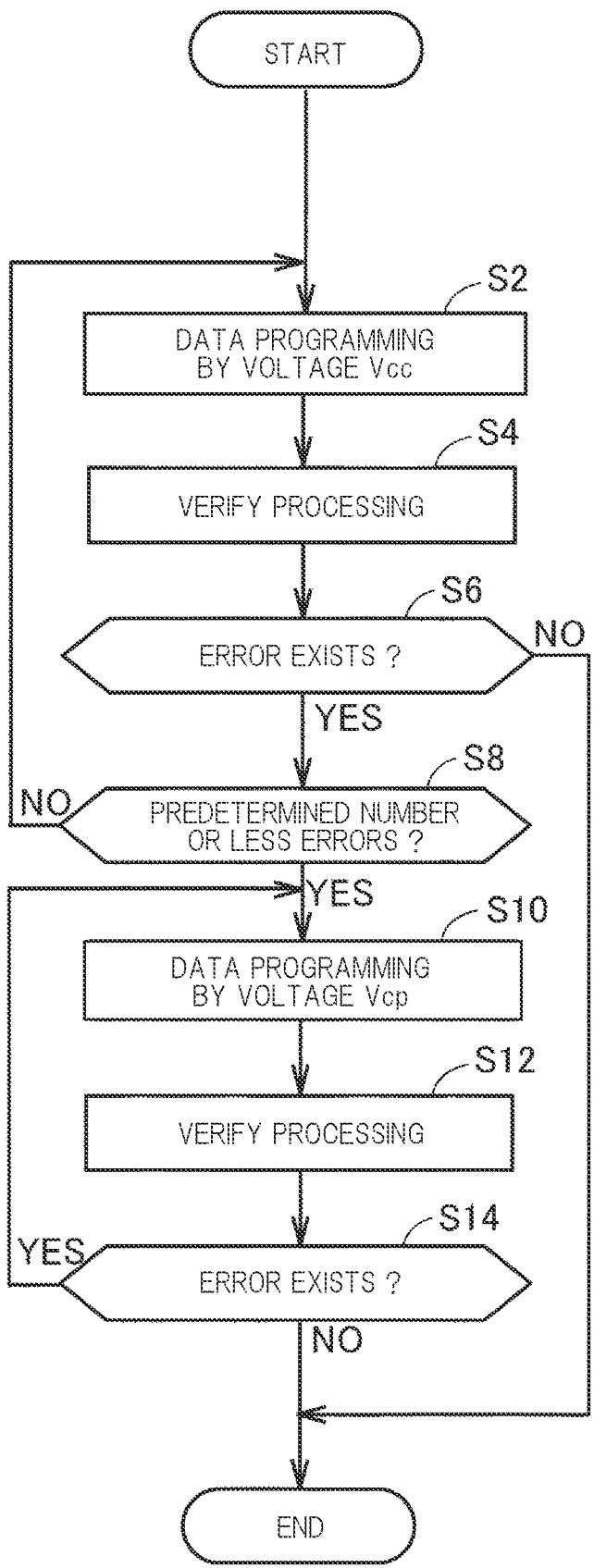
FIG. 7 is a diagram illustrating a flow of the data write processing in the first mode of the storage unit 100 according to the embodiment.

FIG. 7 is a diagram illustrating a flow of the data write processing in the first mode of the storage unit 100 according to the embodiment.

Referring to FIG. 7, the programmable controller 110 executes data programming processing using the voltage Vcc of the external power supply (step S2).

Next, the sequencer 110 executes a verification process (step S4).

Next, the sequencer 110 determines whether or not there is a data write error as the validation processing result (step S6).

In step S6, when it is determined that there is no data write error (NO in step S6), the programmable controller 110 skips the subsequent processing and terminates the data write processing (End).

On the other hand, in step S6, the sequencer 110, when it is determined that there is a data write error (YES in step S6), it is determined whether the number of memory cells in which a data write error occurs is equal to or less than a predetermined number (step S8).

In step S8, when it is determined that the number of memory cells in which a data write error has occurred is equal to or less than a predetermined number (YES in step S8), the programmable controller 110 executes a data write process using the voltage Vcp for the memory cell (step S10). In this case, the sequencer 110 switches the selection indication to be output to the selector SL. Thus, the selector SL supplies the voltage Vcp from the charge pump circuit CP to the power supply line VL.

Next, the sequencer 110 executes a verification process (step S12).

Next, the sequencer 110 determines whether or not there is a data write error as the validation processing result (step S14).

In step S14, when it is determined that there is no data write error (NO in step S14), the programmable controller 110 terminates the data write process (End).

Meanwhile, in step S8, based on the verification processing result, when it is determined that the number of memory cells in which a data write error has occurred is not equal to or less than a predetermined bit (NO in step S8), the programmable controller 110 returns to step S2 and executes the data write process using the voltage Vcc until the number is equal to or less than a predetermined bit. For example, it may be set to 2 bits as a predetermined number.

On the other hand, in step S14, when it is determined that there is a data write error based on the verification processing result (YES in step S14), the programmable controller 110 returns to step S10 and executes the data write process using the voltage Vcp at which the data write error disappears.

In the case of the data programming method of the first mode, in the first data programming process, the data programming process using the voltage of the external power supply is executed, and the data programming process using the boosted voltage Vcp is executed for the memory cell in which the data programming error occurs by the verification process.

As an example, parallel data programming processing using a voltage Vcc is performed for a memory cell of 32 bits in the first data programming processing, and parallel data programming processing using a boosted voltage Vcp is performed for a memory cell of 2 bits or less in which a data programming error occurs in the next (second) data programming processing.

Therefore, data write processing by the boost voltage Vcp is not executed for all bits. As an example, the data write processing by the voltage Vcc is executed until it becomes 2 bits or less, and the data write processing by the boost voltage Vcp is executed when it becomes 2 bits or less. Thus, since it is sufficient to supply the programming current to a small number of bits, it is possible to reduce the circuit area of the charge pump circuit CP. Further, in the second data programming process, it is possible to suppress the occurrence of the data programming error by the data programming process using the boosted voltage Vcp.

Figure 8:
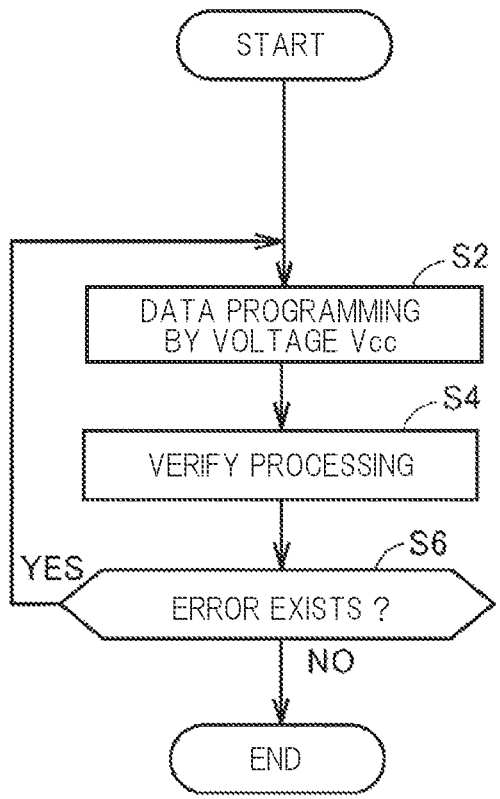
FIG. 8 is a diagram illustrating a flow of the data write processing in the second mode of the storage unit 100 according to the embodiment.

FIG. 8 is a diagram illustrating a flow of the data write processing in the second mode of the storage unit 100 according to the embodiment.

Referring to FIG. 8, the data write processing in the second mode differs from the data write processing in the first mode in that the processing of steps S8 to S14 is not executed in comparison with the data write processing in the first mode.

That is, the programmable controller 110 executes a data write process using the voltage Vcc of the external power supply (step S2).

Next, the sequencer 110 executes a verification process (step S4).

Next, the sequencer 110 determines whether or not there is a data write error as the validation processing result (step S6). In step S6, when it is determined that there is a data write error (YES in step S6), the programmable controller 110 returns to step S2 and executes the data write process using the data voltage Vcc again until there is no data write error.

Then, in step S6, when it is determined that there is no data write error (NO in step S6), the programmable controller 110 terminates the data write process (End).

In the case of the data programming method of the second mode, it is possible to reliably suppress the occurrence of the data programming error in order to execute the data programming process using the voltage Vcc until the data programming error disappears.

Figure 9:
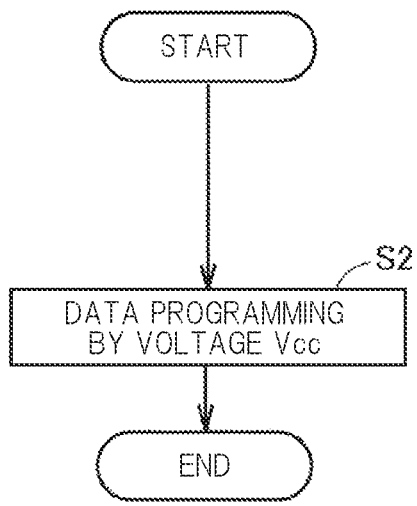
FIG. 9 is a diagram illustrating a flow of the data write processing in the third mode of the storage unit 100 according to the embodiment.

FIG. 9 is a diagram illustrating a flow of the data write processing in the third mode of the storage unit 100 according to the embodiment.

Referring to FIG. 9, the data programming process in the third mode is different from the data programming process in the second mode in that it does not execute the processing in steps S4 to S6.

That is, the programmable controller 110 executes a data write process using the voltage Vcc (step S2).

The sequencer 110 ends the data programming process (end).

In the data write method of the third mode, it is possible to further improve the throughput of the data write process by omitting the validation process.

The semiconductor system 1 according to the embodiment switches the mode of the data write method according to the voltage range of the external power supply as an example.

By adopting a configuration in which the mode of the data programming method can be switched, the versatility of the storage unit 100 can be improved.

In addition, it is possible to reduce the area of the charge pump circuit CP by using the charge pump circuit CP at the time of a data write error of a small number of bits rather than using the charge pump circuit CP at all times during the data write process, and thus it is possible to reduce the circuit area. The utilization form of the charge pump circuit CP is not limited to a data programming error of a small number of bits, and may be used in other applications.

According to the configuration according to the embodiment, the data programming process can be changed in a simple manner according to the situation.

First Modification Example

Figure 10:
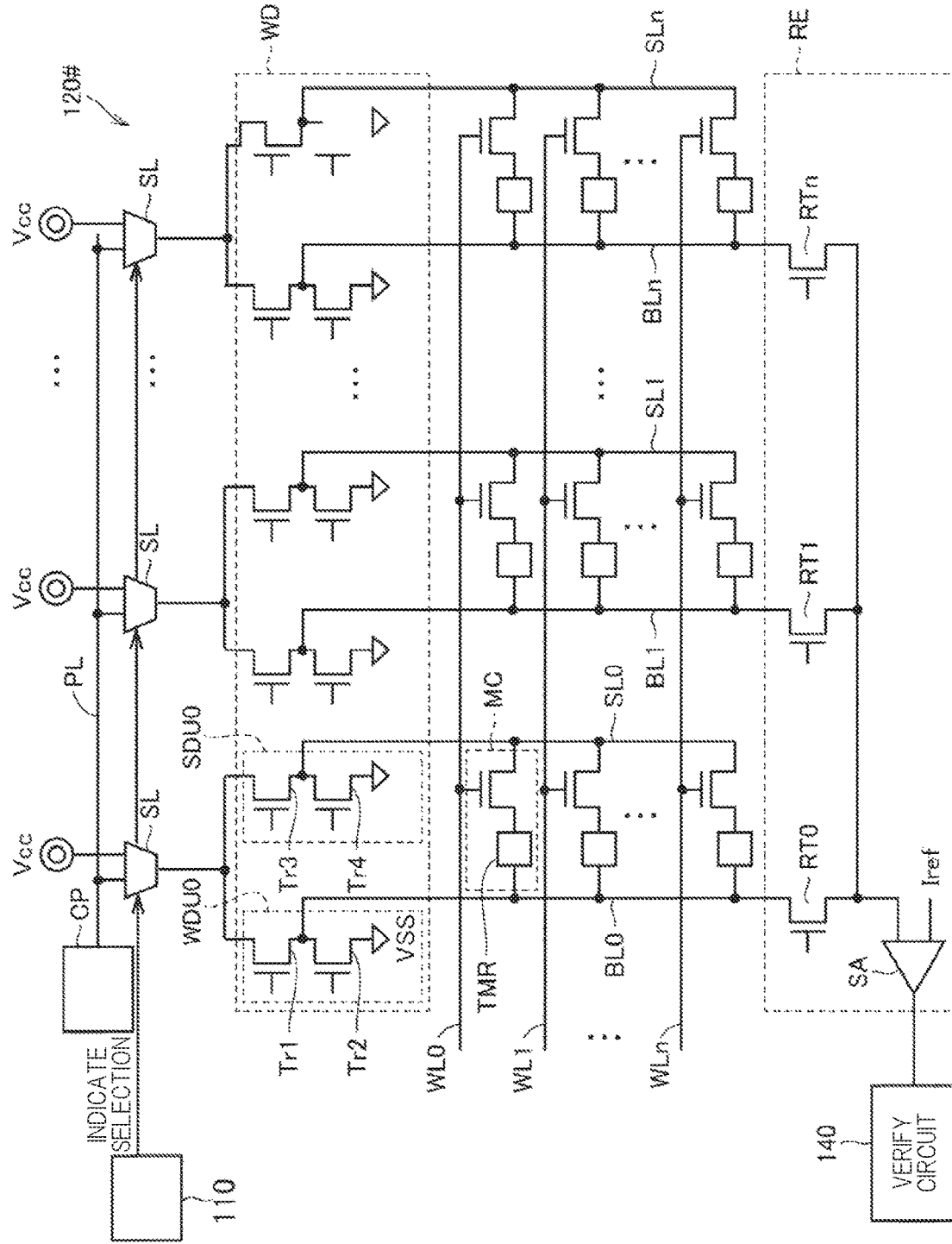
FIG. 10 are a diagram illustrating a configuration of a storage unit 100# based on a first modification example of the embodiment.

FIG. 10 is a diagram illustrating a configuration of a storage unit 100# based on a first modification of the embodiment.

Referring to FIG. 10, the storage unit 100# differs in that replaced the power supply circuit 120 in comparison with the storage unit 100 to the power supply circuit 120#.

Power supply circuit 120# includes a plurality of terminals for receiving the supply of the voltage Vcc of the external power supply, a charge pump circuit CP, and a plurality of selectors SL provided corresponding to each column.

Charge pump circuit CP supplies a voltage Vcp to the power line PL. Each of the plurality of selectors SL, according to the selection indication from the programmable controller, switches the input from the terminal receiving the supply of the voltage Vcc of the external power supply, and the input of the voltage from the power line PL.

For example, the selector SL supplies the voltage Vcc of the external power supply to the power supply nodes of the write units WDU and SDU provided corresponding to each column in accordance with a selection indication ("L" level) from the programmable controller 110.

Further, the selector SL supplies the voltage Vcp from the power supply line PL to the power supply nodes of the write units WDU and SDU provided corresponding to each column in accordance with a selection indication ("H" level) from the programmable controller 110.

With this configuration, together with the voltage to be supplied to the power supply node of the writing unit WDU and SDU provided corresponding to each column by the selection indication from the programmable controller 110, a plurality of terminals are provided corresponding to each selector SL, the power supply line when the distance of VL is long it is possible to prevent the voltage from being reduced by the wiring resistance or the like by the position of the line VL. That is, it is possible to stably supply the voltage Vcc of the external power supply to the write units WDU and SDU of each column even when executing the data write processing of the plurality of bits.

In this example, although one terminal is provided corresponding to the selector SL external power supply is described configuration is provided, not limited thereto, may be configured to provide one terminal corresponding to a plurality of selectors SL, the configuration can be arbitrarily design changed.

Incidentally, since the charge pump circuit CP is used during the data programming process of a small number of bits, it is not necessary to provide a plurality of charge pump circuits, it is possible to reduce the circuit plane lines.

Second Modification Example

FIG. 11 is a diagram for explaining the generation of a selection indication of the sequencer 110 based on a second modification example of the embodiment.

Referring to FIG. 11A, the sequencer 110, as an example, receives the input of information about the voltage of the voltage Vcc of the external power supply from the voltage detection circuit 50 of the power supply circuit 40 of the semiconductor system 1.

The programmable controller 110 changes the data programming method described above according to the voltage range of the external power supply supplied based on the input of the information.

Then, the programmable controller 110 outputs a selection indication to the selector SL as described above according to the data programming method. For example, the power supply line VL according to the selection indication from the sequencer 110 ("L" level), the voltage Vcc is supplied by the switching of the selector SL. Further, the power supply line VL according to the selection indication from the sequencer 110 ("H" level), the voltage Vcp is supplied by the switching of the selector SL.

Referring to FIG. 11B, the sequencer 110, as an example, receives the input of information about the voltage Vcc of the external power supply via the external terminal signal of the semiconductor system 1.

The programmable controller 110 changes the data programming method described above according to the voltage range of the external power supply supplied based on the input of the information.

For example, by inputting a voltage value as information relating to the voltage Vcc of the external power supply to the external terminal signal, the sequencer 110 may change the data programming method.

Alternatively, the programmable controller 110 may receive information indicating the voltage range of the voltage Vcc of the external power supply via the external terminal signal, or may receive input of signals specifying the first to third modes of the data programming system. Design change is facilitated by adjusting according to an instruction from the external terminal signal.

Then, the programmable controller 110 outputs a selection indication to the selector SL as described above according to the data programming method. For example, the power supply line VL according to the selection indication from the sequencer 110 ("L" level), the voltage Vcc is supplied by the switching of the selector SL. Further, the power supply line VL according to the selection indication from the sequencer 110 ("H" level), the voltage Vcp is supplied by the switching of the selector SL.

Referring to FIG. 11C, the sequencer 110, as an example, receives the input of information about the voltage Vcc of the external power supply held in the internal register RG of the semiconductor system 1.

The programmable controller 110 changes the data programming method described above according to the voltage range of the external power supply supplied based on the input of the information.

Then, the programmable controller 110 outputs a selection indication to the selector SL as described above according to the data programming method. For example, the power supply line VL according to the selection indication from the sequencer 110 ("L" level), the voltage Vcc is supplied by the switching of the selector SL. Further, the power supply line VL according to the selection indication from the sequencer 110 ("H" level), the voltage Vcp is supplied by the switching of the selector SL.

For example, when the voltage range of the external power supply is predetermined in advance, by registering the information in the internal register RG, the programmable controller 110 may change the data programming method. For example, it may be a person indicating the voltage value of the voltage Vcc of the external power supply as information to be registered, or may be information indicating the voltage range of the voltage Vcc of the external power supply, or may be information specifying the first to third modes of the data programming system. By adjusting based on the information of the internal register RG, it becomes easy to develop a general-purpose usage form.

Referring to FIG. 11D, the sequencer 110, as an example, receives the input of information about the voltage Vcc of the external power supply according to the detection result of the voltage detection circuit LVD provided inside the storage unit 100.

The programmable controller 110 changes the data programming method described above according to the voltage range of the external power supply supplied based on the input of the information.

Then, the programmable controller 110 outputs a selection indication to the selector SL as described above according to the data programming method. For example, the power supply line VL according to the selection indication from the sequencer 110 ("L" level), the voltage Vcc is supplied by the switching of the selector SL. Further, the power supply line VL according to the selection indication from the sequencer 110 ("H" level), the voltage Vcp is supplied by the switching of the selector SL.

When the voltage is supplied to the inside of the storage unit 100, there is a case where a deviation has occurred between the value of the voltage Vcc of the actual external power supply. High accuracy determination is possible by changing the data programming method described above according to the voltage range of the external power supply to which the programmable controller 110 is supplied based on the detection result of the internal voltage detection circuit LVD.

In this example, MRAM (Magnetic Random Access Memory) devices are mainly used. Not limited to this, but ReRAM (Resistive random access memory and PCRAM (Phase-Change Random Access Memory devices, which are resistance-changing memory devices and the like are similarly applicable.

In the embodiment, a case will be described in which a plurality of data programming systems are selected according to the voltage range of the external power supply, but a plurality of data programming systems may be selected according to other parameters, particularly, regardless of the voltage range of the external power supply. For example, the data programming scheme may be changed according to the environmental temperature. For example, in the case of a high temperature state, the data write method of the first mode may be executed, in the case of a normal state, the data write method of the second mode may be executed, and in the case of a low temperature state, the data write method of the third mode may be executed. In addition, these may be combined, or the data programming method may be selected according to other conditions.

While the present disclosure has been specifically described with reference to embodiments, it is needless to say that the present disclosure is not limited to the embodiment and may be variously modified without departing from the scope thereof.

What is claimed is:

1. A semiconductor device comprising:
   a plurality of memory cells;
   a write circuit for supplying a write current to the memory cells;
   a power supply circuit for supplying power to the write circuit, wherein the power supply circuit includes:
      a charge pump circuit for boosting an external power supply; and
      a selection circuit for switching between a voltage of the external power supply and a boosted voltage boosted by the charge pump circuit to supply the power to the write circuit; and
   a control circuit i) executes data write processing using the voltage of the external power supply, ii) determines whether a number of errors that occurred during the data write processing executed using the voltage of the external power supply is equal to or less than a predetermined number, iii) continue executing the data write processing using the voltage of the external power supply when the number of errors is not equal to or less than the predetermined number, and iv) control the selection circuit to switch from the voltage of the external power supply to the boosted voltage and execute data write processing using the boosted voltage when the number of errors is equal to or less than the predetermined number.

2. The semiconductor device according to claim 1,
   wherein the power supply circuit includes a power supply line, and
   wherein the power supply line is provided connectably with the external power supply at a plurality of locations.

3. The semiconductor device according to claim 1,
   wherein the control circuit receives an input from an external terminal as voltage information of the external power supply.

4. The semiconductor device according to claim 1,
   wherein the control circuit receives an input of information held in a register as voltage information of the external power supply.

5. The semiconductor device according to claim 1,
   wherein the control circuit receives an input of a detection result from a voltage detection circuit as voltage information of the external power supply.

6. A semiconductor system comprising:
   a storage unit; and
   a CPU for controlling the storage unit,
   wherein the storage unit includes a plurality of memory cells, a write circuit for supplying a write current to the memory cells, and a power supply circuit for supplying power to the write circuit,
   wherein the power supply circuit includes a charge pump circuit for boosting an external power supply; and a selection circuit for switching between a voltage of the external power supply and a boosted voltage boosted by the charge pump circuit to supply the power to the write circuit, and
   wherein the CPU i) executes data write processing using the voltage of the external power supply, ii) determines whether a number of errors that occurred during the data write processing executed using the voltage of the external power supply is equal to or less than a predetermined number, iii) continue executing the data write processing using the voltage of the external power supply when the number of errors is not equal to or less than the predetermined number, and iv) control the selection circuit to switch from the voltage of the external power supply to the boosted voltage and execute data write processing using the boosted voltage when the number of errors is equal to or less than the predetermined number.

* * * * *